US008842258B2

(12) United States Patent
Ahn et al.

(10) Patent No.: US 8,842,258 B2
(45) Date of Patent: Sep. 23, 2014

(54) EXPOSURE APPARATUS, EXPOSURE METHOD, AND BLIND FOR EXPOSURE APPARATUS

(75) Inventors: Bo-Kyoung Ahn, Cheonan-si (KR); Hong-Suk Yoo, Anyang-si (KR); Chang-Hoon Kim, Asan-si (KR)

(73) Assignee: Samsung Display Co., Ltd. (KR)

( * ) Notice: Subject to any disclaimer, the term of this patent is extended or adjusted under 35 U.S.C. 154(b) by 533 days.

(21) Appl. No.: 13/071,962

(22) Filed: Mar. 25, 2011

(65) Prior Publication Data

US 2012/0088196 A1    Apr. 12, 2012

(30) Foreign Application Priority Data

Oct. 7, 2010  (KR) .......................... 10-2010-0097809

(51) Int. Cl.
    *G03F 7/20*    (2006.01)
(52) U.S. Cl.
    CPC .................................. *G03F 7/70066* (2013.01)
    USPC ............................................................ 355/71
(58) Field of Classification Search
    CPC ............ G03F 7/70066; G03F 7/70083; G03F 7/70558
    USPC .................................. 355/71, 67, 75; 430/397
    See application file for complete search history.

(56) References Cited

U.S. PATENT DOCUMENTS

| 6,542,223 | B1 * | 4/2003 | Okazaki ........................... 355/67 |
| 6,906,789 | B2 * | 6/2005 | Carter et al. .................... 355/75 |
| 2007/0058150 | A1 * | 3/2007 | Bouman ........................ 355/69 |
| 2010/0002220 | A1 * | 1/2010 | Tanaka ........................... 355/71 |

* cited by examiner

*Primary Examiner* — Peter B Kim
(74) *Attorney, Agent, or Firm* — Cantor Colburn LLP

(57) ABSTRACT

An exposure apparatus includes a mask, a substrate which passes through a region disposed below the mask while moving in a first direction, a light source unit disposed above the mask, where the light source irradiates light on the substrate through the mask, and at least one blind disposed below the light source unit, where the blind blocks the light irradiated from the light source unit, where a second direction is perpendicular to the first direction in a same plane as the first direction, the blind is a polyhedron having a width, a length and a thickness and is disposed such that a direction of the length is substantially parallel to the second direction, and the blind is rotatable around a rotation axis substantially parallel to the second direction, and where the width is greater than the thickness.

20 Claims, 17 Drawing Sheets

EXPOSURE APPARATUS, EXPOSURE METHOD, AND BLIND FOR EXPOSURE APPARATUS

This application claims priority to Korean Patent Application No. 10-2010-0097809, filed on Oct. 7, 2010, and all the benefits accruing there from under 35 U.S.C. §119, the content of which in its entirety is herein incorporated by reference.

BACKGROUND OF THE INVENTION

1. Field of the Invention

The general inventive concept relates to an exposure apparatus, an exposure method and a blind for the exposure apparatus, and more particularly to an exposure apparatus, an exposure method and a blind for the exposure apparatus with improved reliability of an exposure process.

2. Description of the Related Art

Generally, a semiconductor device is fabricated through a plurality of processes such as an ion implantation process, a deposition process, a diffusion process and a photolithography process, for example. Among these processes, the photolithography process is typically performed to form a predetermined pattern on a substrate.

The photolithography process typically includes a coating process for coating a photoresist solution on a substrate, a baking process for hardening the coated photoresist solution to form a photoresist film, an exposure process for transferring a pattern of a mask to the photoresist film, and a developing process for forming a photoresist pattern using the mask pattern.

The exposure process is a process for optically reducing and transferring a pattern of a mask on a substrate with a photoresist film formed thereon using an optical system to form an optical path. The exposure process is performed using an exposure apparatus, e.g., a scanner.

Recently, the price of the mask used in the exposure process increases geometrically due to the increased size of the substrate, and a bending phenomenon of the mask or the like occurs.

Accordingly, an exposure apparatus using a plurality of small masks during the exposure of the substrate (so-called small mask exposure apparatus) has been proposed. The small mask exposure apparatus may provide many advantages such as mask cost reduction, reduction of the bending phenomenon of the mask, and accuracy of alignment.

In the small mask exposure apparatus, however, the operation of the blind performing a light blocking function causes a difference in the amount of exposure, thereby generating stains on the entire surface of the substrate. Although the blind stains may be invisible in a transmission mode, it is difficult to distinguish the blind stains from other stains, e.g., coating stains, foreign substance stains or the like. Accordingly, it may cause determination errors in the panel inspection. Further, the blind stains may be visible in the panel operation, thereby substantially reducing reliability of exposure.

BRIEF SUMMARY OF THE INVENTION

The general inventive concepts relate to an exposure apparatus, an exposure method and a blind for the exposure apparatus with improved reliability of an exposure process by controlling an operation of the blind performing a light blocking function during the exposure process.

In an exemplary embodiment, an exposure apparatus includes a mask, a substrate which passes through a region disposed below the mask while moving in a first direction, a light source unit disposed above the mask, where the light source irradiates light on the substrate through the mask, and at least one blind disposed below the light source unit, where the at least one blind blocks the light irradiated from the light source unit, where a second direction is perpendicular to the first direction in a same plane as the first direction, the at least one blind is a polyhedron having a width, a length and a thickness and is disposed such that a direction of the length is substantially parallel to the second direction, and the at least one blind is rotatable around a rotation axis substantially parallel to the second direction, and where the width of the at least one blind is greater than the thickness of the at least one blind.

In an exemplary embodiment, an exposure method performed in the exposure apparatus includes exposing the substrate to light while the at least one blind is arranged at an outside of an exposure window defined by the light source unit, and moving at least a portion of the at least one blind in a direction opposite to the first direction for a non-exposure region defined on the substrate to be processed during exposing the substrate to the light, wherein the at least one blind is in a second state, in which the width corresponds to the vertical direction and the thickness corresponds to the first direction, when the at least one blind moves in the direction opposite to the first direction.

In another exemplary embodiment, a blind for an exposure apparatus includes a polyhedral body having a width, a length, a thickness and a rotation axis parallel to a direction of the length, and to which is connected a rotating unit, such that the polyhedral body is rotatable around the rotation axis, wherein the width is larger than the thickness.

BRIEF DESCRIPTION OF THE DRAWINGS

The above and other aspects and features of this disclosure will become more apparent by describing in further detail exemplary embodiments thereof with reference to the attached drawings, in which.

DETAILED DESCRIPTION OF THE INVENTION

Figure 1:
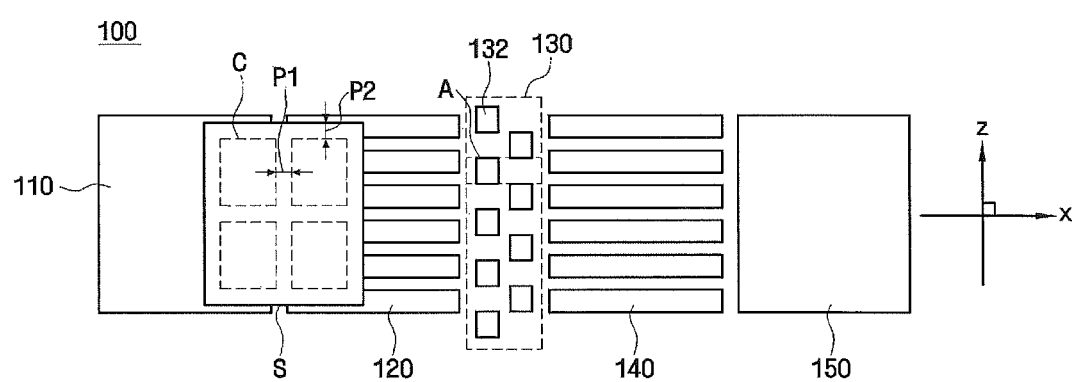
FIG. 1 is a top plan view schematically showing an exemplary embodiment of an exposure apparatus according to the present invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the present invention will be described in further detail with reference to the accompanying drawings.

Figure 2:
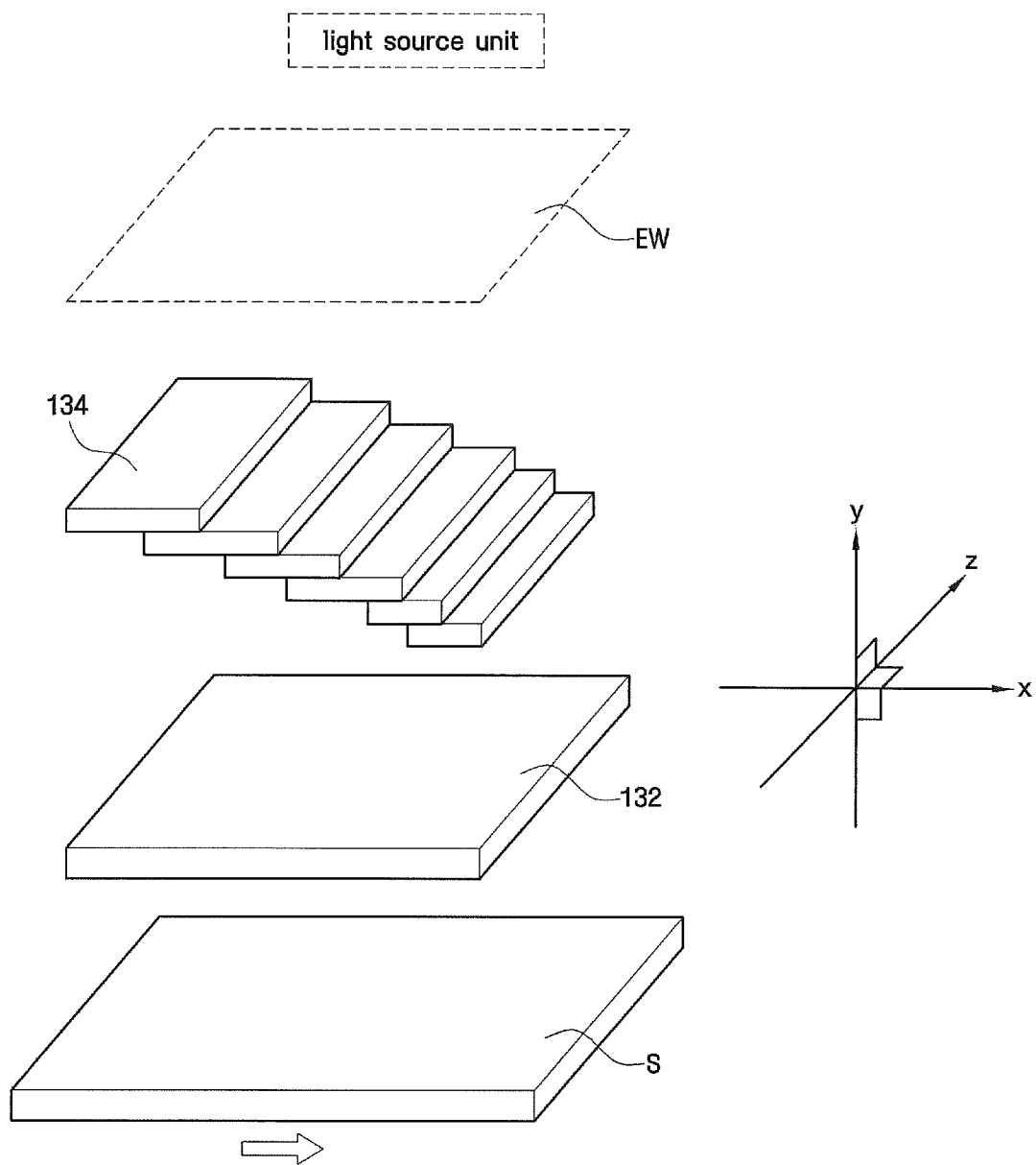
FIG. 2 is a perspective view showing an exemplary embodiment of a unit mask region of the exposure apparatus of FIG. 1.
Figure 3:
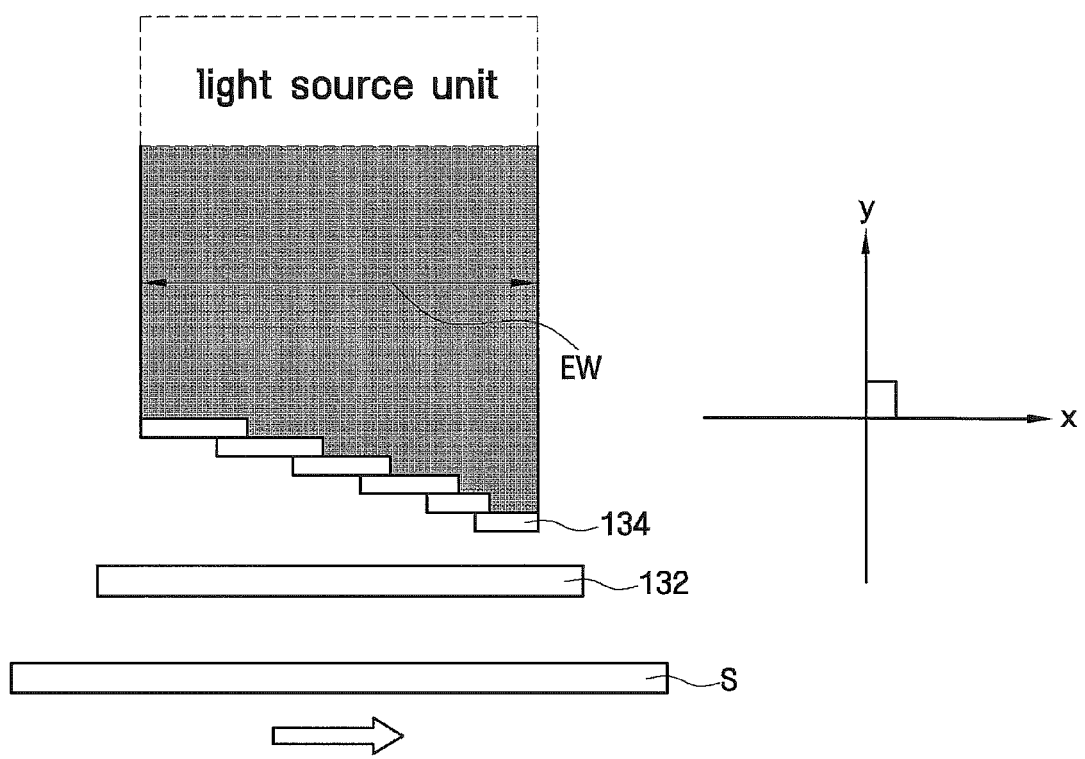
FIG. 3 is a cross-sectional view showing the unit mask region of the exposure apparatus of FIG. 1.
Figure 4:
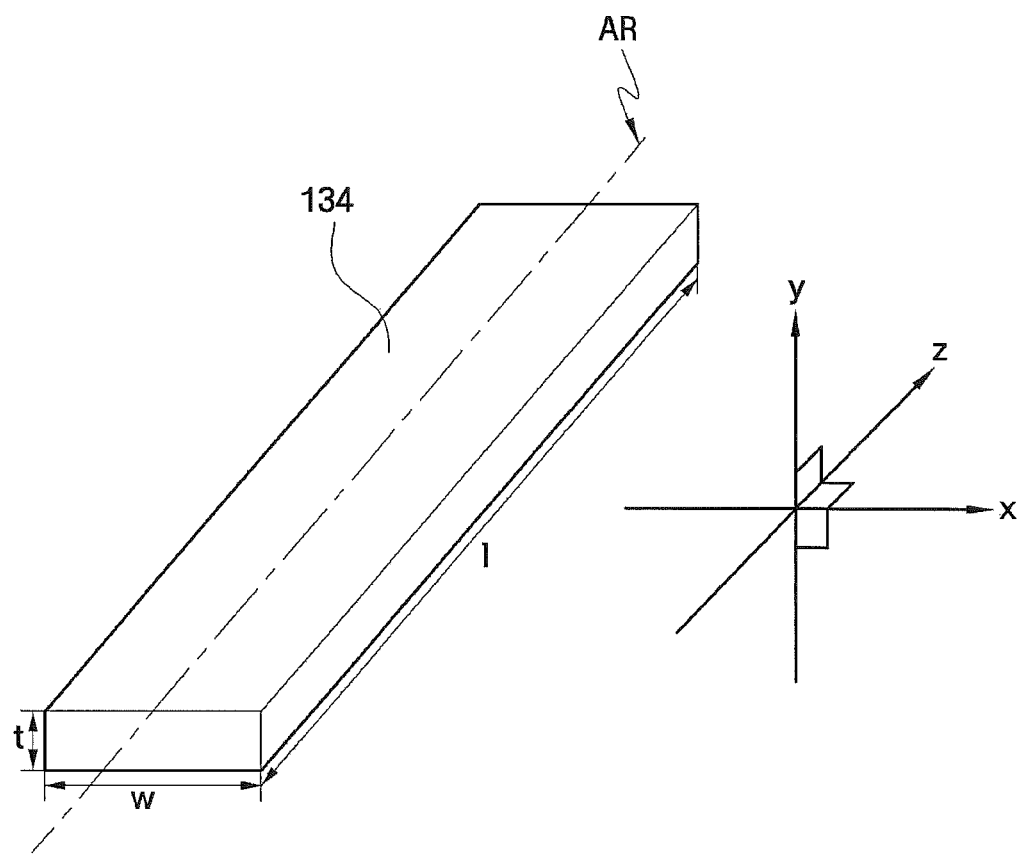
FIG. 4 is an enlarged perspective view of an exemplary embodiment of a blind of FIGS. 2 and 3.

First, exemplary embodiments of an exposure apparatus and an exposure method according to the present invention will be described in detail with reference to FIGS. 1 to 4. FIG. 1 is a top plan view schematically showing an exemplary embodiment of an exposure apparatus according to the present invention. FIG. 2 is a perspective view showing an exemplary embodiment of a unit mask region of the exposure apparatus of FIG. 1. FIG. 3 is a cross-sectional view showing the unit mask region of the exposure apparatus of FIG. 1. FIG. 4 is an enlarged perspective view of an exemplary embodiment of a blind of FIGS. 2 and 3.

Referring to FIG. 1, an exposure apparatus 100 includes a loading unit 110, a first transfer unit 120 and a second transfer unit 140, an exposure unit 130 and an unloading unit 150.

A substrate S with a photoresist film disposed thereon is loaded on the loading unit 110 of the exposure apparatus 100 such that the substrate S undergoes an exposure process.

The first transfer unit 120 transfers the substrate S loaded on the loading unit 110 to the exposure unit 130. In an exemplary embodiment, the substrate S may be transferred at a substantially constant speed from left to right in an x-axis direction. Hereinafter, for convenience of explanation, a transfer direction of the substrate S and its opposite direction are referred to as an x-axis direction, and a direction perpendicular to the x-axis direction on the plane of FIG. 1 is referred to as a z-axis direction. Further, although not shown in FIG. 1, a direction perpendicular to the x-axis and z-axis directions is referred to as a y-axis direction, as shown in FIGS. 2 to 4.

The exposure unit 130 is a unit which substantially performs an exposure process on the substrate S transferred by the first transfer unit 120. The exposure unit 130 includes a light source unit (not shown) which irradiates light on the substrate S provided to the exposure unit 130, and masks 132 used to transfer a predetermined pattern to the photoresist film of the substrate S. In this case, the light source unit (not shown) is provided to be disposed above the substrate S in the y-axis direction. The light source unit may include a light source that emits light, an illumination unit that converts the light emitted from the light source into collimated light, and the like. The masks 132 have a predetermined pattern and are disposed between the light source unit and the substrate S, which are arranged in the y-axis direction.

The light emitted from the light source unit of the exposure unit 130 is irradiated on the masks 132. The light that has passed through the masks 132 includes image information of the pattern formed on the masks 132. The light including the image information is irradiated on the substrate S to transfer the pattern of the masks to the photoresist film disposed on the substrate S.

In an exemplary embodiment, the masks 132 are small masks that are arranged on the x-z plane and allow regions of the substrate S to be selectively exposed to the light. In an exemplary embodiment, the masks 132 include nine masks alternately arranged in a zigzag pattern in the z-axis direction instead of being arranged linearly in the z-axis direction, such that the substrate S is divided into nine regions in the z-axis direction to be exposed to the light. However, exemplary embodiment of the masks is not limited thereto, and the number or the arrangement of the masks 132 may be modified.

The substrate S having undergone the exposure process via the exposure unit 130 is transferred to the unloading unit 150 by the second transfer unit 140.

The unloading unit 150 unloads the substrate S having undergone the exposure process such that a subsequent process (e.g., developing process) after the exposure process is performed on the substrate S.

An exposure method performed in the exposure apparatus 100 will be described in detail below.

The substrate S loaded on the loading unit 110 may be continuously transferred at a substantially constant speed in the x-axis direction from left to right, i.e., successively through the first transfer unit 120, the exposure unit 130, the second transfer unit 140 and the unloading unit 150.

When the substrate S is provided to the exposure unit 130, the substrate S is exposed to the light sequentially from the right side to the left side of the substrate S according to a moving speed of the substrate S. When the exposure has been completed, the substrate S is unloaded from the exposure unit 130. Specifically, while the substrate S moves from left to right in the x-axis direction, right and left portions of the substrate S are sequentially positioned below the masks 132. Accordingly, the pattern of the masks 132 is substantially transferred to the photoresist film of the substrate S.

In this case, the substrate S includes, as shown in FIG. 1, regions C to which the light is exposed (hereinafter, referred to as "exposure regions"), and regions P1 and P2 to which the light is not exposed (hereinafter, referred to as "non-exposure regions"). In an exemplary embodiment, the substrate S may be divided into the exposure regions C on which require the pattern is formed and the non-exposure regions P1 and P2 on which the pattern is not formed. In an exemplary embodiment, the exposure regions C may be cell regions, and the non-exposure regions P1 and P2 may be edge portions of the cell regions. In an exemplary embodiment, the exposure regions C may be arranged in the form of a matrix on the x-z plane and be separated from each other while the non-exposure regions P1 and P2 are interposed between the exposure regions C.

In the non-exposure regions P1 and P2, however, the light exposure to the non-exposure region P2 between the exposure regions C adjacent to each other in the z-axis direction may be effectively blocked using the pattern of the masks 132, whereas the light exposure to the non-exposure region P1 between the exposure regions C adjacent to each other in the x-axis direction may not be effectively blocked using the pattern of the masks 132. In an exemplary embodiment, a light blocking member (also, referred to as "blind") selectively blocks the non-exposure region P1 of the substrate S from light exposure while the substrate S is exposed to the light.

In an exemplary embodiment, the exposure unit 130 of the exposure apparatus 100 may further include the blind in addition to the light source unit and the masks 132. The blind is illustrated in FIGS. 2 to 4 and will be described in greater detail below.

Hereinafter, a configuration of the exposure unit 130 and an exposure method preformed in the exposure unit 130 will be described in greater detail with reference to FIGS. 2 to 4. For convenience of explanation, the following description will be made on a region A (see FIG. 1) including only one mask among the masks 132 included in the exposure unit 130. The region including only one mask of the masks 132 included in the exposure unit 130 is hereinafter referred to as a unit mask region. As shown in FIG. 1, an exemplary embodiment of the exposure unit 130 may include nine unit mask regions.

Referring to FIGS. 2 to 4, the light source unit, one mask of the masks 132, and N blinds 134 (N is a natural number greater than or equal to 1) are provided in the unit mask region.

As described above, the substrate S is disposed below the mask 132 and moves in the x-axis direction from left to right (see an arrow of FIG. 2).

Further, as mentioned above, the light source unit is arranged above the substrate S in the y-axis direction, and the mask 132 is arranged between the light source unit and the substrate S in the y-axis direction. The light source unit includes a light source and an illumination unit including a mirror or lens to emit collimated light irradiated substantially vertically to the mask 132 or the substrate S moving below the mask 132. The light emitted from the light source unit is shown as a shaded area in FIG. 3. A region on the x-z plane on which light is irradiated from the light source unit is hereinafter also referred to as an exposure window EW.

The blinds 134 serve to selectively block light to effectively prevent the non-exposure region P1 (see FIG. 1) of the substrate S from being exposed to light during the light exposure to the substrate S. One or more blinds are arranged in the unit mask region. In an exemplary embodiment, one or more blinds 134 are provided for each mask 132 of the exposure unit 130. In an exemplary embodiment, the blinds 134 that prevent the light from being irradiated on corresponding portions of the substrate S may be arranged between the light source unit and the mask 132 in the y-axis direction, as shown in FIG. 2. In an alternative exemplary embodiment, the blinds 134 may be arranged between the mask 132 and the substrate S in the y-axis direction.

Each of the blinds 134 may have a polyhedron shape having widths in x-axis, y-axis and z-axis directions, e.g., a rectangular parallelepiped shape. Hereinafter, as shown in FIG. 4, a width of the blind 134 in the x-axis direction is referred to as a width w of the blind 134, a width of the blind 134 in the y-axis direction is referred to as a thickness t of the blind 134, and a width of the blind 134 in the z-axis direction is referred to as a length l of the blind 134. The width w, thickness t and length l of the blind 134 are defined in a state where the blind 134 is laid down, and are not changed even in a state where the blind 134 is erected. A laid state or an erect state will be described later.

In this case, the thickness t or length l of the blind 134 may have a fixed value, whereas the width w of the blind 134 may be changed according to the specification of the exposure apparatus 100 or requirements of the exposure process. Further, the width w of the blind 134 is greater than the thickness t of the blind 134. The length l of the blind 134 may be greater than or equal to the width of the exposure window EW in the z-axis direction. The blind 134 may be formed of, e.g., a carbon fiber having a width w in a range of about 5 mm to about 20 mm and a thickness of about 1 mm.

The N blinds 134 are disposed above the mask 132. When blocking the light emitted from the light source unit, the blinds 134 are arranged in the laid state in which a direction of the width w is disposed in the x-axis direction, a direction of the length l is disposed in the z-axis direction and a direction of the thickness t is disposed in the y-axis direction. When the blinds 134 do not perform a light blocking function, for example, when the blinds 134 move in a direction opposite to a moving direction of the substrate S or when the blinds 134 are located on the outside of the exposure window EW, the blinds 134 may be arranged in the erect state in which the direction of the width w is disposed in the y-axis direction, the direction of the length l is disposed in the z-axis direction and the direction of the thickness t is disposed in the x-axis direction.

The N blinds 134 may be arranged at different heights in the y-axis direction such that distances between the mask 132 and the respective blinds 134 are different. Further, the N blinds 134 may have a total width in the x-axis direction substantially the same as the width of the exposure window EW in the x-axis direction when the N blinds 134 are distributed, such that the N blinds 134 substantially cover the entire exposure window EW when the N blinds 134 are distributed along the x-axis direction. Accordingly, as shown in FIG. 3, when the N blinds 134 are arranged at different heights in the y-axis direction and the adjacent blinds 134 partially overlap each other, the sum of the respective widths of the N blinds 134 is greater than the width of the exposure window EW in the x-axis direction.

As described above, the length l of each of the blinds 134 may be equal to or larger than the width of the exposure window EW in the z-axis direction. Accordingly, if the N blinds 134 have a total width in the x-axis direction when the N blinds 134 are distributed, which is substantially the same as the width of the exposure window EW in the x-axis direction, the N blinds 134 may substantially cover the entire exposure window EW on the x-z plane.

In an alternative exemplary embodiment, while satisfying the above-mentioned conditions of the width w, the N blinds 134 may have different widths w, or the N blinds 134 may be divided into groups such that the blinds 134 of a certain group have the same width w, which is different from the width w of the blinds 134 of another group. The widths of the blinds 134 may be predetermined according to the width of the exposure window EW in the x-axis direction and according to the width of the non-exposure region as will be described later.

Each of the N blinds 134 may move in the x-axis direction for the non-exposure region to be processed and move in the y-axis direction to adjust a distance between the mask 132 and each of the blinds 134. Further, each of the N blinds 134 may rotate around a rotation axis AR (see FIG. 4) that is substantially parallel to the z-axis direction. The rotation of the blinds 134 is performed to prevent blind stains that may occur when the blinds 134 move in a direction opposite to the moving direction of the substrate S for the non-exposure region to be processed, which will be described later.

In an exemplary embodiment, six blinds 134 are arranged above the mask 132, and every two blinds have the same width w. The six blinds 134 are arranged at different heights in the y-axis direction, and distances between the blinds 134 and the mask 132 gradually decrease from left to right. However, the exemplary embodiments of the blind are not limited thereto. In an alternative exemplary embodiment, the number of the blinds 134, the width w of each of the blinds 134, a distance between mask 132 and each blind 134 or the like may be changed.

Hereinafter, an exemplary embodiment of an exposure process, e.g., the exposure process performed in the exposure apparatus of FIGS. 1 to 4, and an operation of the blinds during the exposure process, will be described in detail with reference to FIGS. 5 to 9. FIGS. 5 to 9 are cross-sectional views showing steps of an exemplary embodiment of the exposure method according to the present invention.

Figure 5:
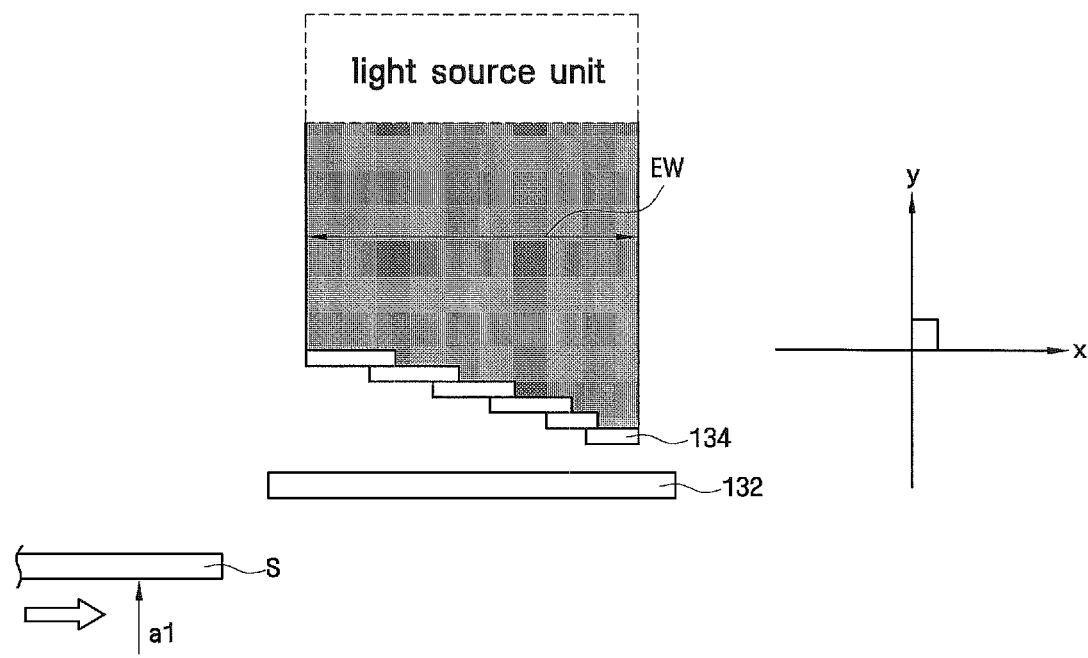
FIGS. 5 to 9 are cross-sectional views showing steps of exemplary embodiment of an exposure method according to the present invention.

As shown in FIG. 5, at an initial state before the exposure, the N blinds 134 are arranged above the mask 132 and distributed along the x-axis direction to cover the entire exposure window EW.

When the blinds 134 are arranged as shown in FIG. 5, the substrate S moves from left to right in the x-axis direction, and the exposure starts when a start point (e.g., the point indicated by an arrow a1) of the exposure region of the substrate S is positioned corresponding to a left end of the exposure window EW. When the exposure starts, the N blinds 134, sequentially from the left, move in the x-axis direction from left to right. In an exemplary embodiment, the moving speed of the substrate S is substantially equal to the moving speed of the blinds 134. In an exemplary embodiment, the exposure window EW is gradually opened from the left at substantially the same speed as the moving speed of the substrate S, and the exposure is performed on the substrate S from the right end to the left end of the substrate S. In an exemplary embodiment, as shown in FIG. 6, all of the blinds 134 may be arranged on the right outside of the exposure window EW.

Figure 6:
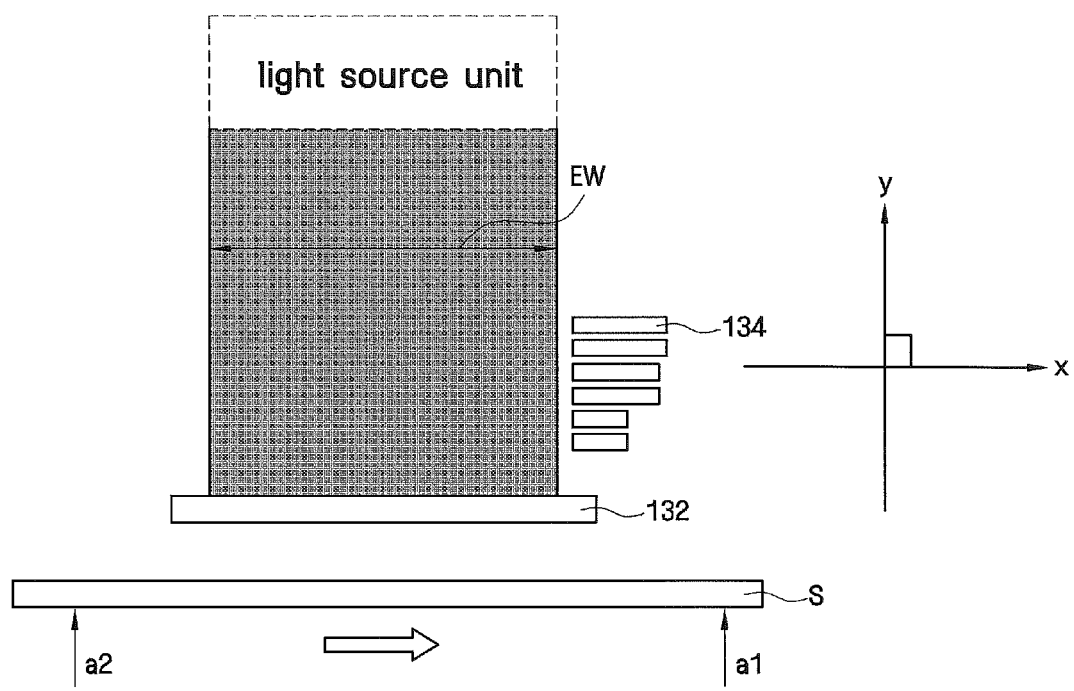

Referring to FIG. 6, since all of the blinds 134 are arranged on the right outside of the exposure window EW, the exposure window EW is opened such that all the light passing through the exposure window EW is irradiated on the exposure region (see a region between arrows a1 and a2) of the substrate S through the mask 132. The arrow a1 indicates the start point of the exposure region as mentioned above, and the arrow a2 indicates both an end point of the exposure region and a start point of the non-exposure region.

When the blinds 134 are arranged as shown in FIG. 6, the exposure region (between the arrows a1 and a2) of the substrate S, sequentially from the right, is exposed to the light while the substrate S moves in the x-axis direction from left to right. Then, when the start point a2 of the non-exposure region of the substrate approaches the exposure window EW, some of the blinds 134 begin to move as shown in FIG. 7.

Figure 7:
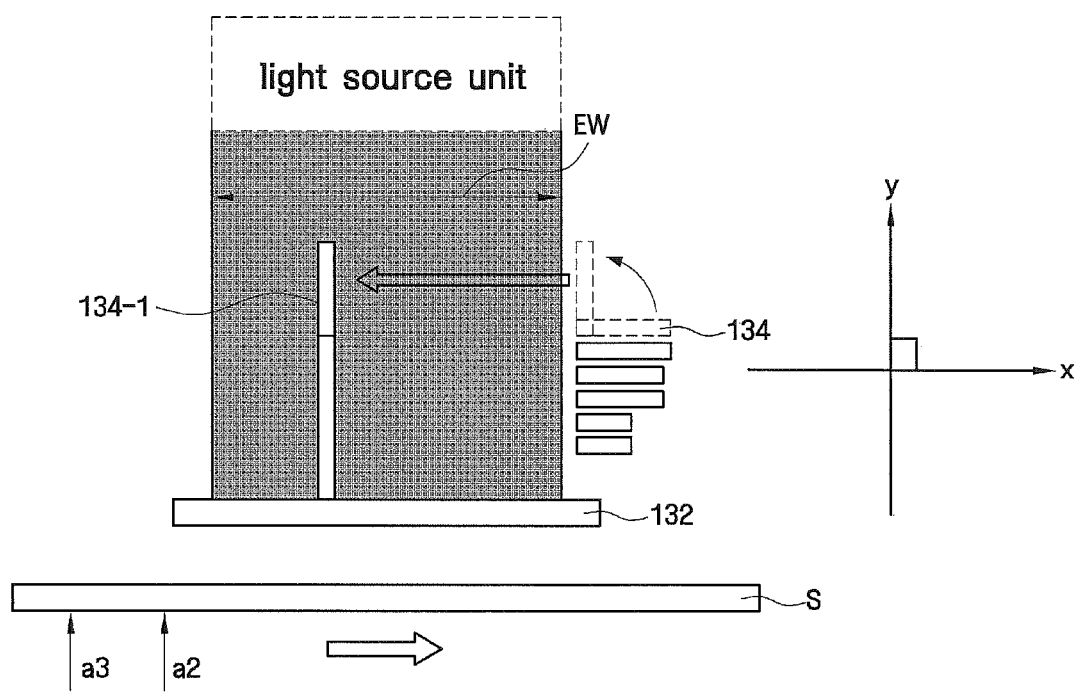

Referring to FIG. 7, when the start point a2 of the non-exposure region of the substrate S approaches the exposure window EW during the exposure, some of the N blinds 134 arranged on the right outside of the exposure window EW move in an opposite direction of the moving direction of the substrate S in the x-axis direction for the non-exposure region to be processed. For convenience of explanation, some of the N blinds 134 which move in the opposite direction of the moving direction of the substrate S are hereinafter referred to as at least one blind 134-1. If the number of the at least one blind 134-1 is M, M may be greater than or equal to 1 and less than or equal to N. In an exemplary embodiment, the at least one blind 134-1 includes one blind (i.e., M=1).

In this case, the arrow a2 indicates the start point of the non-exposure region as mentioned above, and an arrow a3 indicates both an end point of the non-exposure region and a start point of a subsequent non-exposure region disposed adjacent to the exposure region (between the arrows a1 and a2) in the x-axis direction. Accordingly, a region between the arrows a2 and a3 corresponds to the non-exposure region of the substrate S.

In this case, before the at least one blind 134-1 moves in the opposite direction of the moving direction of the substrate S, the at least one blind 134-1 is rotated around the rotation axis AR (see FIG. 4) which is substantially parallel to the z-axis direction such that the direction of the width w is disposed in the y-axis direction, the direction of the length l is disposed in the z-axis direction and the direction of the thickness t is disposed in the x-axis direction, e.g., such that the at lest one blind 134-1 is in the erect state. Accordingly, the at least one blind 134-1 moves in the opposite direction of the moving direction of the substrate S while being in the erect state.

However, the movement of the at least one blind 134-1 is not limited to the movement described above, and in an alternative exemplary embodiment, all of the blinds 134 may be in the erect state before the at least one blind 134-1 moves in the opposite direction of the moving direction of the substrate S, and only the at least one blind 134-1 of all of the blinds in the erect state may move. Further, an operation of rotating the at least one blind 134-1 or all of the blinds 134 to be in the erect state may be performed at any time between when all of the blinds 134 are moved to the outside of the exposure window EW and right before the at least one blind 134-1 begins to move.

The reason for moving the at least one blind 134-1 in the erect state is as follows.

The blind 134-1 moves in the opposite direction of the moving direction of the substrate S across the exposure region of the substrate S during the exposure. Since the blind 134-1 inevitably covers a portion of the exposure region of the substrate S on the x-z plane, the amount of exposure on the exposure region becomes different, and stains on the substrate S is thereby made. When the blind 134-1 moves in the laid state, the blind 134-1 has a greater area on the x-z plane. Particularly, because the width of the blind 134-1 in the x-axis direction is relatively great, the blind 134-1 covers a relatively large portion of the exposure region of the substrate S to cause a greater difference in the amount of exposure. On the other hand, when the blind 134-1 moves in the erect state, as shown in FIG. 7, the blind 134-1 has a less area on the x-z plane. Since the width of the blind 134-1 in the x-axis direction is relatively less, the blind 134-1 covers a relatively small portion of the exposure region of the substrate S to substantially reduce the difference in the amount of exposure, and the blind stain occurrence is thereby effectively prevented.

In an exemplary embodiment, the at least one blind 134-1 is provided for the non-exposure region to be processed between the arrows a2 and a3, that is, to selectively cover only the non-exposure region between the arrows a2 and a3 during the exposure process for the on-exposure region. Accordingly, the total width of the at least one blind 134-1 in the laid state may be substantially equal to the width of the non-exposure region between the arrows a2 and a3 in the x-axis direction.

In an exemplary embodiment, when the at least one blind 134-1 includes a single blind, the width w of the one blind 134-1 is substantially equal to the width of the non-exposure region between the arrows a2 and a3 in the x-axis direction. In an alternative exemplary embodiment, when the at least one blind 134-1 includes two or more blinds, the total width of the distributed two or more blinds is substantially equal to the width of the non-exposure region between the arrows a2 and a3 in the x-axis direction. That is, when the number of the two or more blinds 134-1 is M and the respective widths thereof are $w_1$ to $w_m$, and the widths of overlapping portions between the adjacent M blinds 134-1 when the M blinds 134-1 are distributed along the x-axis direction are $w'_1$ to $w'_{m-1}$, the total width of the distributed blinds 134-1 is $(w_1 + \ldots + w_m) - (w'_1 + \ldots + w'_{m-1})$.

As shown in FIG. 7, one blind 134-1 having the largest width w among the blinds 134, e.g., the six blinds, has the same width was the width of the non-exposure region between the arrows a2 and a3, and the blind 134-1 may move to correspond to the non-exposure region, but not being limited thereto. In other exemplary embodiments, the number of blinds and which widths of blinds to be selected from the N blinds 134 may vary based on the predetermined width of the non-exposure region between the arrows a2 and a3, and only the selected blinds 134-1 among the blinds 134 move while being in the erect state.

Figure 8:
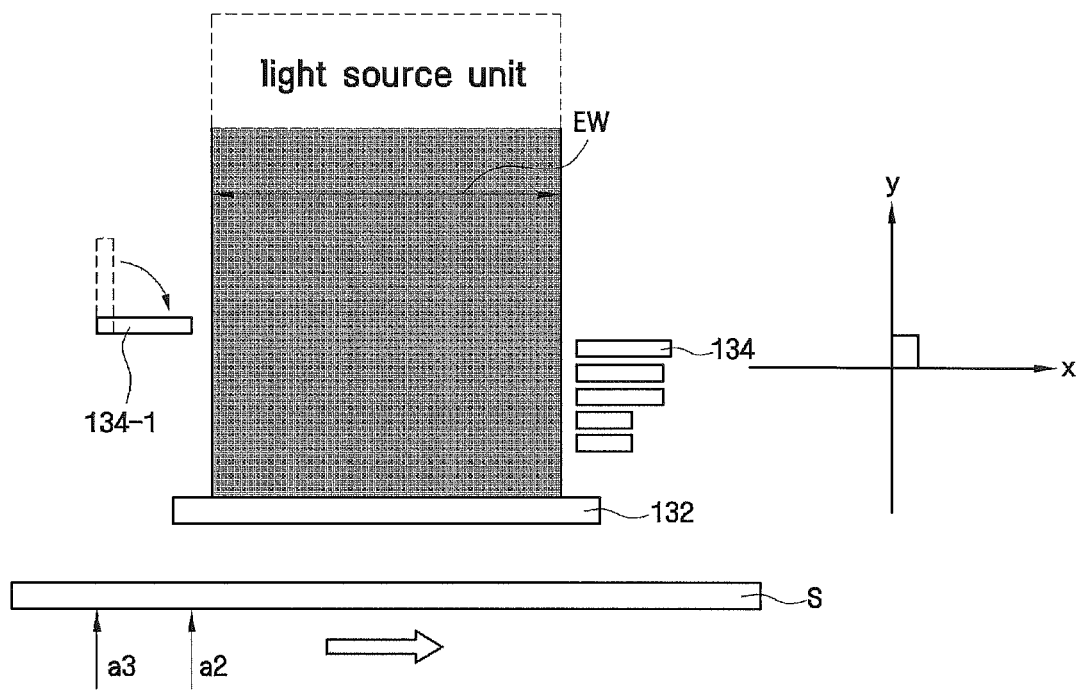

The at least one blind 134-1 moves as shown in FIG. 7, and the at least one blind 134-1 is moved to the left outside of the exposure window EW as shown in FIG. 8.

Referring to FIG. 8, the blind 134-1 rotates around the rotation axis parallel to the z-axis direction and restored to the laid state after being moved to the left outside of the exposure window EW. In an exemplary embodiment, the at least one blind 134-1 rotates to be in the laid state before the start point a2 of the non-exposure region of the substrate S corresponds to the left end of the exposure window EW. In particular, the rotation of the blind 134-1 is performed such that the start point a2 of the non-exposure region of the substrate S corresponds to a right end of the at least one blind 134-1 in the laid state.

When the at least one blind 134-1 rotates to be in the laid state such that the start point a2 of the non-exposure region corresponds to the right end of the blind 134-1, the at least one blind 134-1 selectively covers only the non-exposure region between the arrows a2 and a3 because the width w of the blind 134-1 is substantially equal to the width of the non-exposure region between the arrows a2 and a3.

Figure 9:
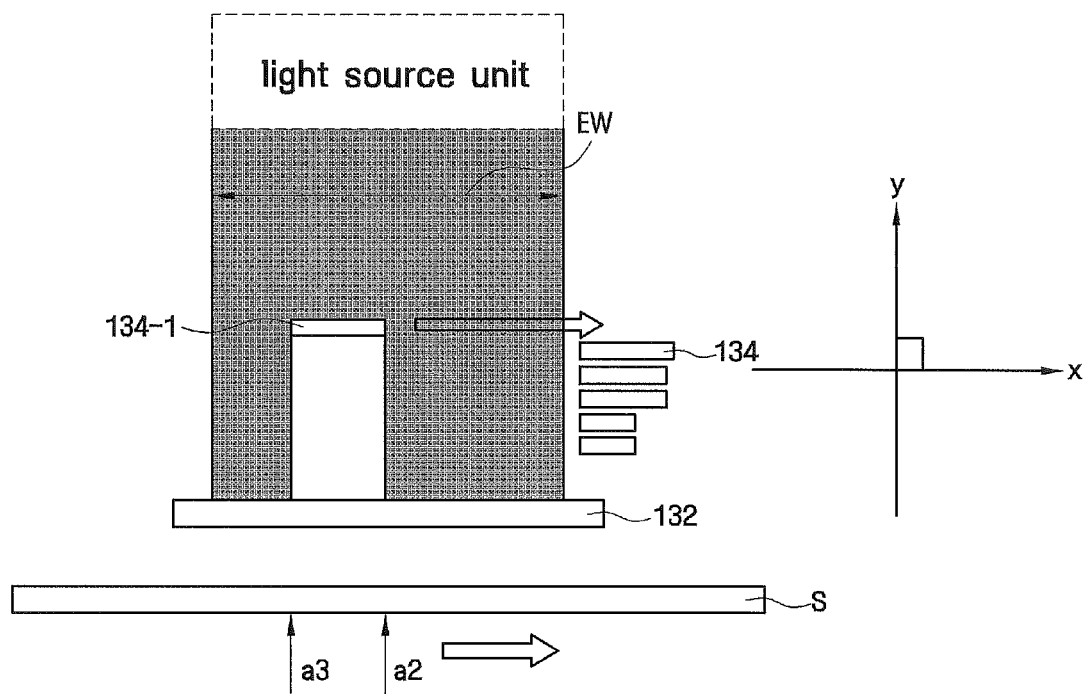

While the at least one blind 134-1 selectively covers only the non-exposure region between the arrows a2 and a3, as shown in FIG. 8, the substrate S and the at least one blind 134-1 move at substantially the same speed in the x-axis direction from left to right as shown in FIG. 9.

Referring to FIG. 9, the substrate S and the at least one blind 134-1 move at substantially the same speed in the x-axis direction from left to right. Accordingly, the non-exposure region between the arrows a2 and a3 is continuously covered by the blind 134-1, and the other region is exposed to light, and the exposure is thereby continuously performed.

The substrate S and the at least one blind 134-1 continue to move until they are positioned outside the exposure window EW. Then, the substrate S continues to move in the x-axis direction and the at least one blind 134-1 returns to the state where it is located on the right outside of the exposure window EW, i.e., substantially the same state as in FIG. 6.

When the blinds 134 are in a state substantially the same as the state in FIG. 6, the substrate S is continuously exposed to light. Then, when another non-exposure region of the substrate S approaches the exposure window EW, the steps of FIGS. 7, 8 and 9 are repeated performed. That is, while the exposure region and the non-exposure region of the substrate S alternately move below the exposure window EW, a cycle of the steps of FIGS. 6 to 9 is repeatedly performed.

As described in the steps of FIGS. 5 to 9, when the at least one blind 134-1 is moved for the non-exposure region to be processed, the at least one blind 134-1 rotates to be in the erect state and moves while being in the erect state. Accordingly, the at least one blind 134-1 covers a relatively small portion of the exposure region of the substrate S to substantially reduce a difference in the amount of exposure to the exposure region on the substrate. Thus, the occurrence of blind stains is effectively prevented and the reliability of exposure is substantially improved.

Figure 10A:
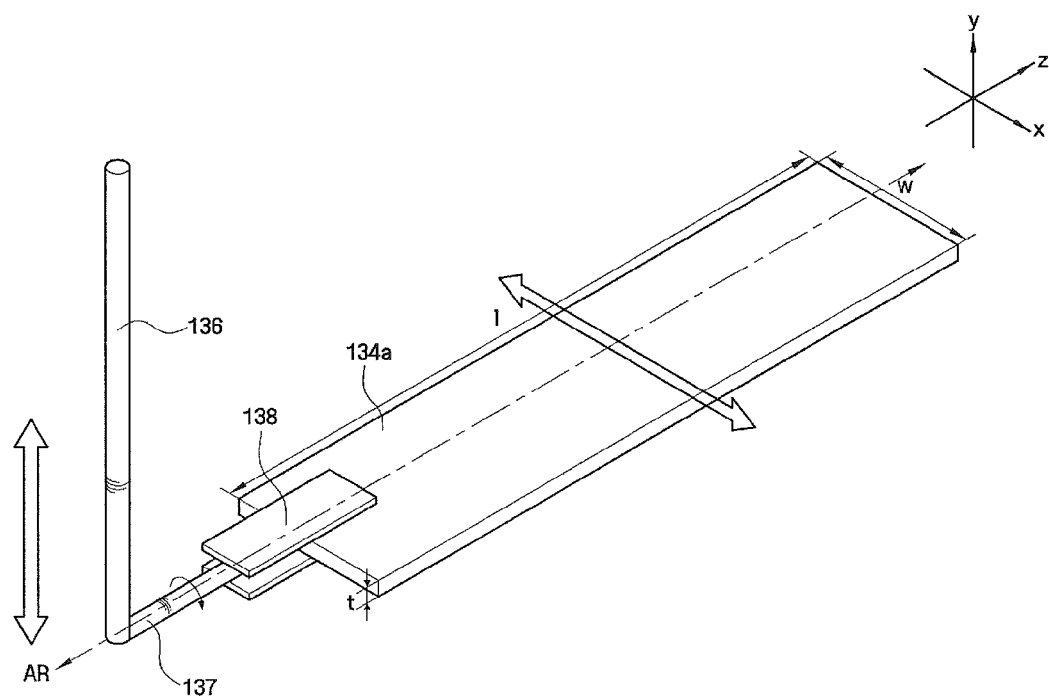
FIGS. 10A and 10B are perspective views showing an exemplary embodiment of a blind according to the present invention.
Figure 10B:
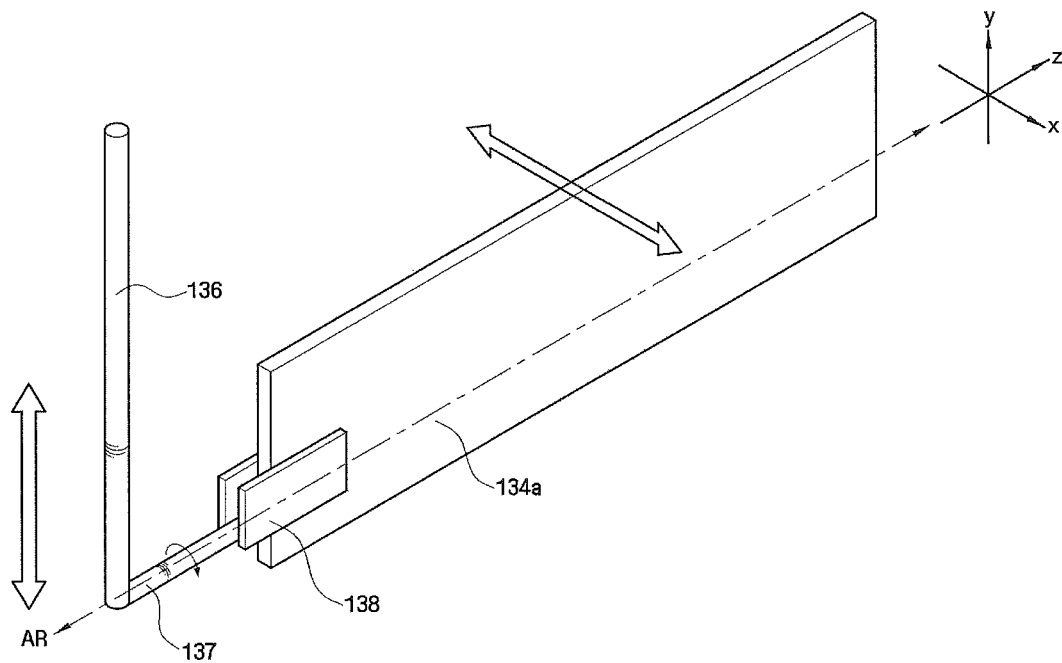
Figure 11:
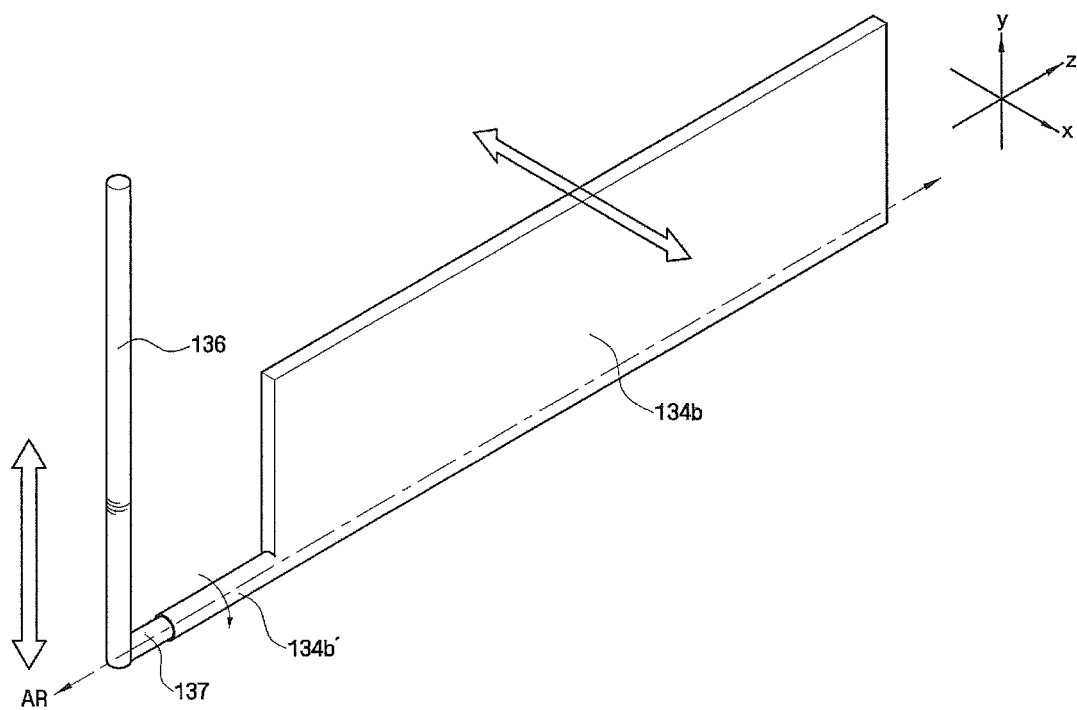
FIG. 11 is a perspective view showing an alternative exemplary embodiment of the blind according to the present invention.

Hereinafter, an exemplary embodiment of a blind used in the exposure apparatus will be described in greater detail with reference to FIGS. 10A to 12E. FIGS. 10A and 10B are perspective views showing an exemplary embodiment of the blind. FIG. 11 is a perspective view showing an alternative exemplary embodiment of the blind. FIGS. 12A to 12E are cross sectional views showing other alternative exemplary embodiments of the blind. Particularly, FIGS. 12A to 12E show cross-sections of exemplary embodiment of the blind having a width and a thickness, i.e., cross-sections of the exemplary embodiments of the blind on the x-y plane.

Referring to FIGS. 10A and 10B, the blind 134a may have a structure substantially the same as the structure of the blinds 134 described above, e.g., the blind 134a may have a rectangular parallelepiped shape. In a laid state (see FIG. 10A), a length of the blind 134a in the x-axis direction corresponds to the width w of the blind 134a, a length of the blind 134a in the y-axis direction corresponds to the thickness t of the blind 134a, and a length of the blind 134a in the z-axis direction corresponds to the length l of the blind 134a. In an exemplary embodiment, the width w of the blind 134a is greater than the thickness t thereof.

The blind 134a may be in an erect state (see FIG. 10B) by being rotated around the rotation axis AR, which is substantially parallel to the z-axis direction, from the laid state. In the erect, the blind 134a has the thickness t positioned along the x-axis direction and the width w positioned along the y-axis direction. An angle of rotation may be in a range from about 90 degrees to about 360 degrees.

In an exemplary embodiment, the blind 134a is configured to move along the x-axis direction and along the y-axis direction.

The blind 134a is supported by a supporting unit 138 which holds the blind 134a. The blind 134a is connected to a moving unit 136 which move in the x-axis direction and in the y-axis direction, and a rotating unit 137 which rotates around the rotation axis AR that is substantially parallel to the z-axis direction. Specifically, the supporting unit 138 of the blind 134a is connected to the rotating unit 137 and rotates with the rotating unit 137 for the rotation of the blind 134a. The rotating unit 137 is connected to the moving unit 136 for the movement of the blind 134a in the x-axis direction and in the y-axis direction.

In an exemplary embodiment, the rotation axis AR of the blind 134a may be disposed below the center of the width w of the blind 134a in the erect state in the y-axis direction, it is thereby substantially minimized a difference between a distance between the mask and the blind 134a in the laid state (see a distance between the mask 132 and the blind 134 of FIG. 7) and a distance between the mask and the blind 134a in the erect state after being rotated.

Referring to FIG. 11, an alternative exemplary embodiment of the blind in FIG. 11 is substantially the same as the blind shown in FIGS. 10A and 10B except for the supporting unit. The same or like elements shown in FIG. 11 have been labeled with the same reference characters as used above to describe the exemplary embodiments of the blind shown in FIGS. 10A and 10B, and any repetitive detailed description thereof will hereinafter be omitted or simplified.

As shown in FIG. 11, the blind 134b may not have a separate supporting unit. The blind 134b is configured to be connected integrally with the rotating unit 137. That is, the blind 134b includes a body having a rectangular parallelepiped shape and a connecting unit 134b' which protrudes toward the rotating unit 137 and is shaped to be coupled with the rotating unit 137. In an exemplary embodiment, when the rotating unit 137 has a cylindrical shape, the connecting unit 134b' may have a circular pipe shape to provide a space for insertion of the rotating unit 137 and to surround the rotating unit 137. The connecting unit 134b' is coupled with the rotating unit 137 such that the connecting unit 134b' rotates together with the rotating unit 137. However, the structures of exemplary embodiments of the rotating unit and the connecting unit are not limited thereto. The shape of the rotating unit 137, the shape of the connecting unit 134b', a coupling relationship or the like may be variously modified according to the present invention.

As shown in FIGS. 12A to 12E, the cross-sections of blinds 134c to 134g may be variously modified. As shown in FIGS. 12A to 12E, the respective cross-sections of exemplary embodiments of the blind 134c to 134g are cross-sections having a width and a thickness, i.e., cross-sections of the blinds on the x-y plane, particularly, in the erect state.

Figure 12A:
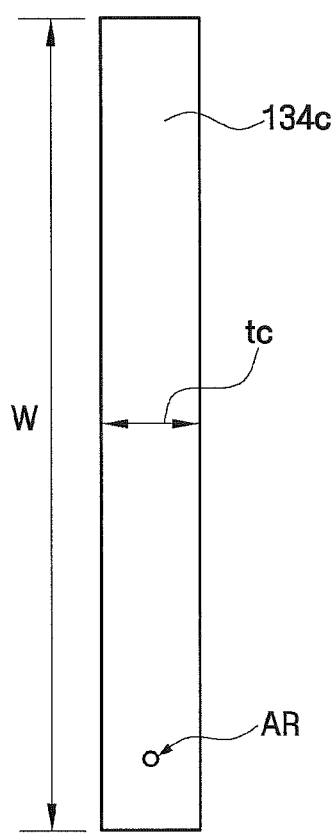
FIGS. 12A to 12E are cross-sectional views showing other exemplary embodiments of the blind according to the present invention.

The cross section of the blind 134c shown in FIG. 12A is substantially the same as the cross-section of the blind 134a shown in FIG. 10 or the blind 134b shown in FIG. 11. That is, the cross-section of the blind 134c has a rectangular shape and a thickness tc of the blind 134c in the y-axis direction is constant. As described above, the rotation axis AR of the blind 134c may be provided below the center of the width w of the blind 134c in the y-axis direction.

Figure 12B:
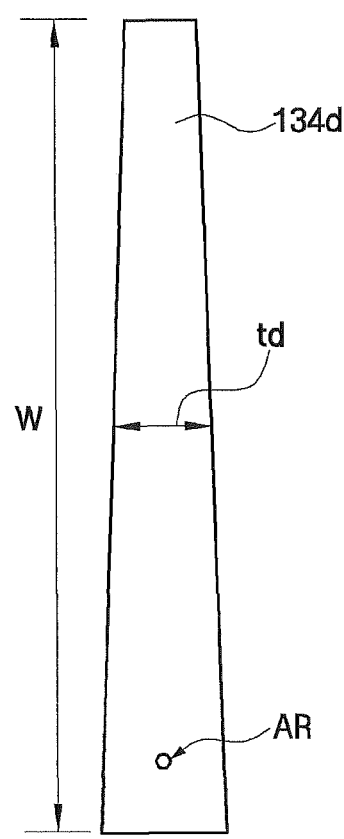

In an exemplary embodiment, the cross-section of the blind 134d shown in FIG. 12B has a trapezoidal shape. Particularly, a thickness td of the blind 134d decreases from bottom to top in the y-axis direction. As described above, the rotation axis AR of the blind 134d may be provided below the center of the width w of the blind 134d in the y-axis direction.

Figure 12C:
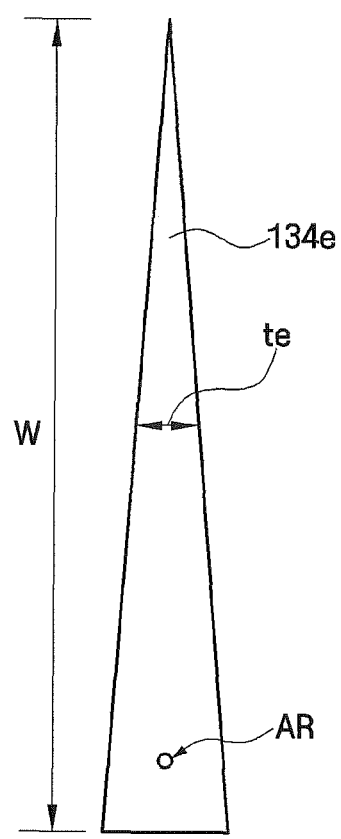

The cross-section of an exemplary embodiment of the blind 134e shown in FIG. 12C has a substantially triangular shape. Particularly, a thickness to of the blind 134e decreases from one end, e.g., a lower end, to another end, e.g., an upper end, in the y-axis direction. As described above, the rotation axis AR of the blind 134e may be provided below the center of the width w of the blind 134e in the y-axis direction.

Figure 12D:
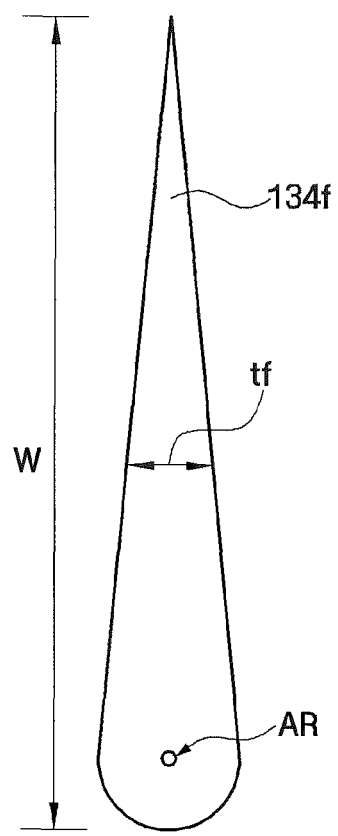

The cross-section of an exemplary embodiment of the blind 134f shown in FIG. 12D has a needle shape with one end of a sharp point and another end of a circular shape. Particularly, the one end may be arranged at the upper end and the other end may be arranged at the lower end in the y-axis direction. Accordingly, a thickness tf of the blind 134f generally decreases from bottom to top in the y-axis direction. As described above, the rotation axis AR of the blind 134f may be provided below the center of the width w of the blind 134f in the y-axis direction.

Figure 12E:
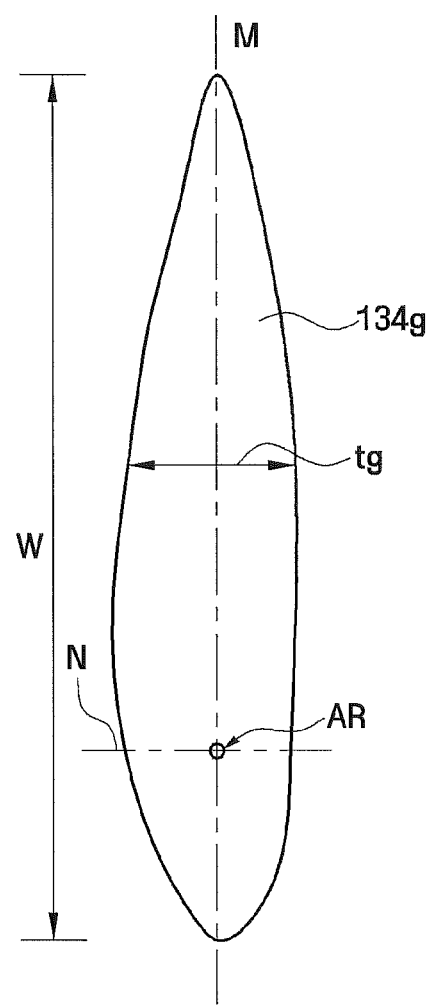

The cross-section of the blind 134g of FIG. 12E has a needle-like shape with one end of a sharp point and the other end of a circular shape. In an exemplary embodiment, the one end may be arranged at the top side and the other end may be arranged at the lower side with respect to the y-axis direction. A thickness tg of the blind 134g may generally decrease from one end, e.g., a lower end, to another end, e.g., an upper end, in the y-axis direction. Particularly, when the cross-section of the blind 134g is divided into first to fourth quadrants by a line M connecting the center of the rotation axis AR with a portion having the smallest thickness and a line N connecting the center of the rotation axis AR with a portion having the largest thickness, the first to fourth quadrants may have different gradients. As described above, the rotation axis AR of the blind 134g may be provided below the center of the width w of the blind 134g with respect to the y-axis direction.

Referring to FIGS. 12B to 12E, the thicknesses td to tg of exemplary embodiments of the blind 134d to 134g have cross-sections with a feature in common in which the thicknesses td to tg are greater at a portion including the rotation axis AR and decrease from the rotation axis AR to opposite ends in the y-axis direction. Accordingly, air resistance can be reduced when the blinds 134d to 134g move. Also, since the center of mass is located near the rotation axis AR along the z-axis direction, the balance of the blind 134d to 134g may be effectively maintained when the blind rotates.

Although the exposure apparatus for performing the exposure wherein the exposure unit is provided at a fixed position and the substrate moves in one direction, for example, a small mask exposure apparatus, has been described in the above embodiments, the invention is not limited thereto. The invention may include other type of exposure apparatus, e.g., all exposure apparatuses including a blind having a thickness smaller than a width, the blind being moved to deal with the non-exposure region.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. An exposure apparatus comprising:
   a mask;
   a substrate which passes through a region disposed below the mask while moving in a first direction;
   a light source unit disposed above the mask, wherein the light source unit irradiates light on the substrate through the mask; and
   at least one blind disposed below the light source unit, wherein the at least one blind blocks the light irradiated from the light source unit,
   wherein a second direction is perpendicular to the first direction and in a same plane as the first direction, the at least one blind is a polyhedron having a width, a length and a thickness and is disposed such that a direction of the length is substantially parallel to the second direction, and the at least one blind is rotatable around a rotation axis substantially parallel to the second direction and which extends through the polyhedron,
   wherein the width of the at least one blind is greater than the thickness of the at least one blind and is less than the length, and
   wherein the at least one blind moves in the direction opposite to the first direction.

2. The exposure apparatus of claim 1, wherein the at least one blind rotates to be in at least one of a first state and a second state, wherein a direction of the width corresponds to the first direction and a direction of the thickness corresponds to the vertical direction when the at least one blind is in the first state, and the direction of the width corresponds to the vertical direction and the direction of the thickness corresponds to the first direction when the at least one blind is in the second state.

3. The exposure apparatus of claim 2, wherein the at least one blind is movable in both directions along an axis defining the first direction, and the at least one blind is in the second state when the at least one blind moves in the direction opposite to the first direction.

4. The exposure apparatus of claim 3, wherein the at least one blind is in the first state when the at least one blind moves in the first direction.

5. The exposure apparatus of claim 4, wherein the at least one blind moves at a speed substantially the same as a moving speed of the substrate when the at least one blind moves in the first direction.

6. The exposure apparatus of claim 1, wherein the at least one blind is movable in both directions along an axis defining the first direction and along the vertical direction.

7. The exposure apparatus of claim 1, wherein the at least one blind comprises a carbon fiber.

8. The exposure apparatus of claim 1,
   wherein the mask includes a plurality of sub-masks arranged in the second direction, and
   one of the at least one blind overlaps at least a portion of the plurality of sub-masks.

9. The exposure apparatus of claim 1, comprising a plurality of blinds,
   wherein each of the plurality of blinds is located at different heights in the vertical direction, and
   widths of at least a portion of the plurality of blinds are different from each other.

10. The exposure apparatus of claim 1, wherein the rotation axis is separated from a center of the width by a predetermined distance in a direction of the width.

11. The exposure apparatus of claim 10, wherein the thickness of the at least one blind has the greatest value at a portion including the rotation axis and decreases on moving away from the rotation axis.

12. The exposure apparatus of claim 1, wherein the at least one blind is connected to a rotating unit which is arranged on the rotation axis and rotates around the rotation axis, and
   the at least one blind further includes a connecting unit which protrudes from the polyhedron toward the rotating unit and is coupled with the rotating unit.

13. An exposure method performed in an exposure apparatus comprising: a mask; a substrate which passes through a region disposed below the mask while moving in a first direction; a light source unit disposed above the mask, wherein the light source unit irradiates light on the substrate through the mask; and at least one blind disposed below the light source unit, wherein the at least one blind blocks the light irradiated from the light source unit, wherein a second direction is perpendicular to the first direction and in a same plane as the first direction, the at least one blind is a polyhedron having a width, a length and a thickness and is disposed such that a direction of the length is substantially parallel to the second direction, and the at least one blind is rotatable around a rotation axis substantially parallel to the second direction, and wherein the width of the at least one blind is greater than the thickness of the at least one blind, the method comprising:
   exposing the substrate to the light while the at least one blind is arranged at an outside of an exposure window defined by the light source unit; and
   moving at least a portion of the at least one blind in a direction opposite to the first direction for a non-exposure region defined on the substrate to be processed during exposing the substrate to the light, wherein the at least one blind is in a second state, in which the width corresponds to the vertical direction and the thickness corresponds to the first direction, when the at least one blind moves in the direction opposite to the first direction.

14. The exposure method of claim 13, wherein the portion of the at least one blind is in the second state when the portion of the at least one blind moves until the portion of the at least one blind reaches an opposite outside of the exposure window, which is opposite to the outside of the exposure window.

15. The exposure method of claim 14, further comprising, after the portion of the at least one blind reaches the opposite outside of the exposure window,
   rotating the portion of the at least one blind to be in a first state in which the width corresponds to the first direction and the thickness corresponds to the vertical direction from the second state.

16. The exposure method of claim 15, further comprising, after the portion of the at least one blind rotates, moving the portion of the at least one blind in the first direction at a speed substantially the same as a moving speed of the substrate while the portion of the at least one blind covers the non-exposure region.

17. A blind for an exposure apparatus comprising:
a polyhedral body having a width, a length, a thickness and a rotation axis parallel to a direction of the length, and to which is connected a rotating unit, such that the polyhedral body is rotatable around the rotation axis which extends through the polyhedral body, wherein the width is greater than the thickness and is less than the length, and
wherein the rotation axis is movable in both directions along an axis defining a vertical direction defining one of the width and the thickness in erect and laid states of the polyhedral body, respectively.

18. The blind of claim 17, wherein the rotation axis is disposed apart from a center of the width by a predetermined distance in a direction of the width.

19. The blind of claim 18, wherein the thickness of the blind has the greatest value at a portion including the rotation axis and decreases on moving away from the rotation axis.

20. The blind of claim 17, further comprising a connecting unit which protrudes from the body toward the rotating unit and is coupled with the rotating unit.

* * * * *